US011276778B2

United States Patent
Kajiwara et al.

(10) Patent No.: US 11,276,778 B2
(45) Date of Patent: Mar. 15, 2022

(54) SEMICONDUCTOR DEVICE

(71) Applicant: KABUSHIKI KAISHA TOSHIBA, Tokyo (JP)

(72) Inventors: Yosuke Kajiwara, Yokohama (JP); Masahiko Kuraguchi, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 21 days.

(21) Appl. No.: 17/013,973

(22) Filed: Sep. 8, 2020

(65) Prior Publication Data

US 2021/0167207 A1    Jun. 3, 2021

(30) Foreign Application Priority Data

Dec. 3, 2019    (JP) .............................. JP2019-218728

(51) Int. Cl.
   *H01L 29/78*    (2006.01)
   *H01L 29/417*    (2006.01)
   (Continued)

(52) U.S. Cl.
   CPC ...... *H01L 29/7825* (2013.01); *H01L 29/2003* (2013.01); *H01L 29/41741* (2013.01); *H01L 29/4236* (2013.01)

(58) Field of Classification Search
   CPC ..... H01L 29/20; H01L 29/78; H01L 29/2003; H01L 29/7825; H01L 29/417; H01L 29/41741; H01L 29/423; H01L 29/4236; H01L 29/41758; H01L 29/778; H01L 29/7786; H01L 29/4238; H01L 29/452; H01L 29/475; H01L 29/78681; H01L 29/41725; H01L 29/41791; H01L 29/7839;
   (Continued)

(56) References Cited

U.S. PATENT DOCUMENTS 7,952,117 B2    5/2011   Masuda
8,466,494 B2    6/2013   Tamari
(Continued)

FOREIGN PATENT DOCUMENTS

JP    2009-54632 A    3/2009
JP    2012-18961 A    1/2012
(Continued)

*Primary Examiner* — Chuong A Luu
(74) *Attorney, Agent, or Firm* — Oblon, McClelland, Maier & Neustadt, L.L.P.

(57) ABSTRACT

According to one embodiment, a semiconductor device includes a semiconductor member, a first source electrode, a first gate electrode, a first drain electrode, a source pad part, a first source connection part, and an insulating part. The semiconductor member includes first and second semiconductor layers. The first gate electrode includes first to fourth portions. The first source electrode is between the first and second portions in a first direction, and is between the third and fourth portions in a second. The first drain electrode extends along the first direction. The first source electrode is between the third portion and the first drain electrode in the second direction. The first source connection part electrically connects the first source electrode and the source pad part. A portion of the first insulating region of the insulating part is between the first portion and the first source connection part.

20 Claims, 12 Drawing Sheets

(51) Int. Cl.
*H01L 29/423* (2006.01)
*H01L 29/20* (2006.01)

(58) Field of Classification Search
CPC ............ H01L 29/806; H01L 29/66696; H01L 29/66727; H01L 29/1066; H01L 29/66901; H01L 29/66909; H01L 29/66916; H01L 31/1848; H01L 33/007; H01L 33/0075; H01L 33/0025; H01L 33/0029; H01L 21/18; H01L 21/28575; H01L 21/2215; H01L 21/246; H01L 21/2654; H01L 21/3006; H01L 21/30635; H01L 21/3245; H01L 21/31666; H01L 21/31679
USPC ........................................................ 257/330
See application file for complete search history.

(56) References Cited

U.S. PATENT DOCUMENTS

| | | | |
|---|---|---|---|
| 9,153,682 B2 | 10/2015 | Iwabuchi et al. | |
| 9,508,797 B2 * | 11/2016 | Roberts | H01L 29/0696 |
| 2007/0272957 A1 * | 11/2007 | Johnson | H01L 29/41725 |
| | | | 257/289 |
| 2016/0190278 A1 * | 6/2016 | Yamada | H01L 21/0262 |
| | | | 363/37 |
| 2018/0122929 A1 * | 5/2018 | Linthicum | H01L 21/02381 |

FOREIGN PATENT DOCUMENTS

| | | |
|---|---|---|
| JP | 2012/043334 A1 | 4/2012 |
| JP | 2012-174943 A | 9/2012 |
| JP | 2015-82605 A | 4/2015 |

* cited by examiner

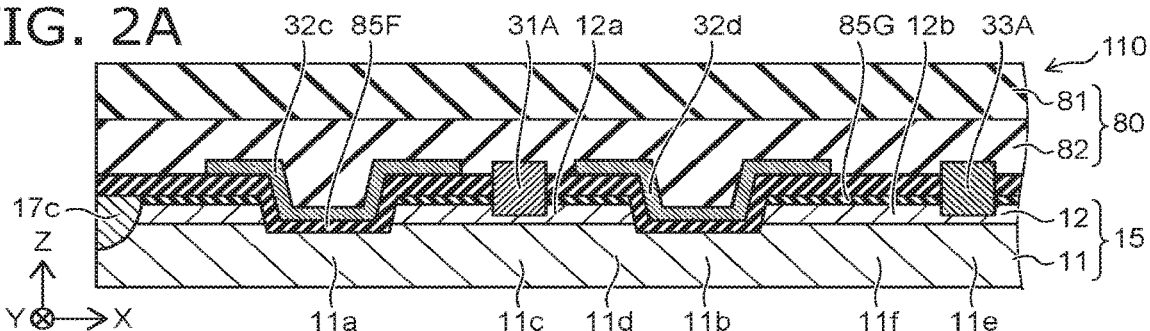
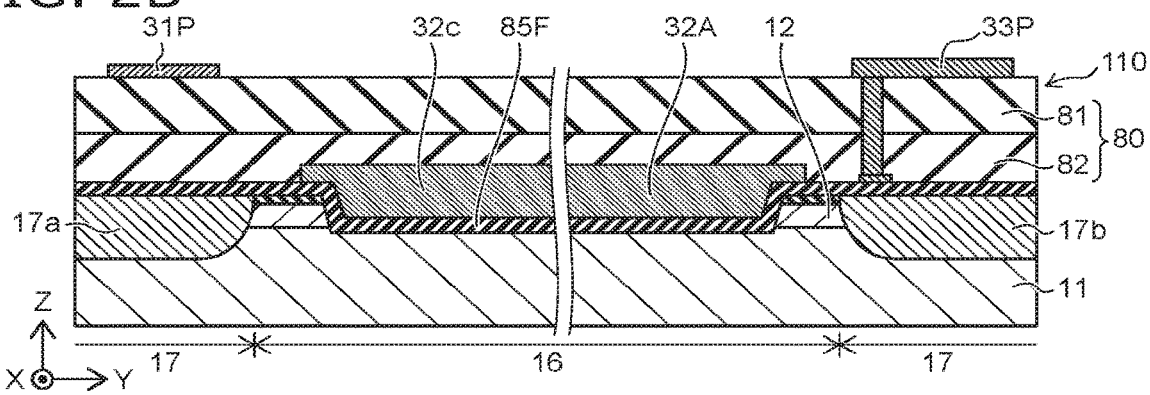
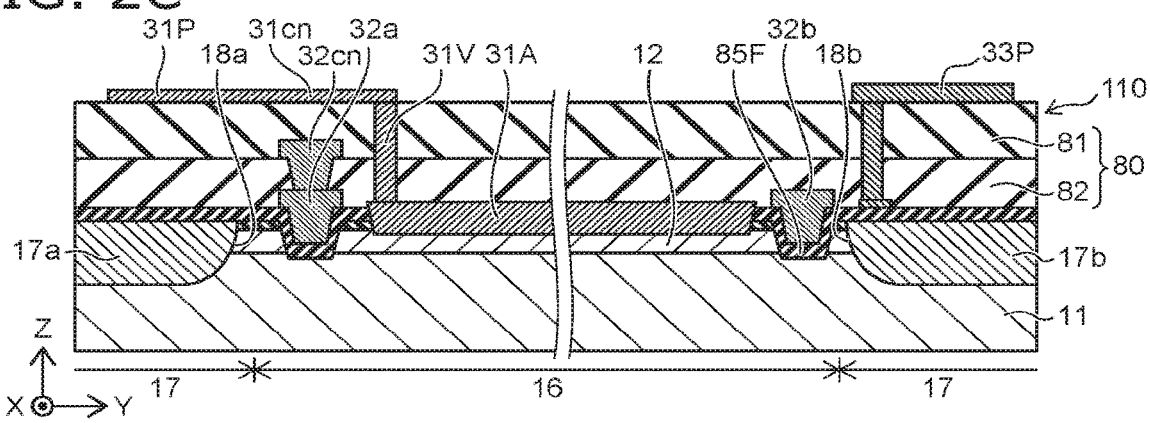
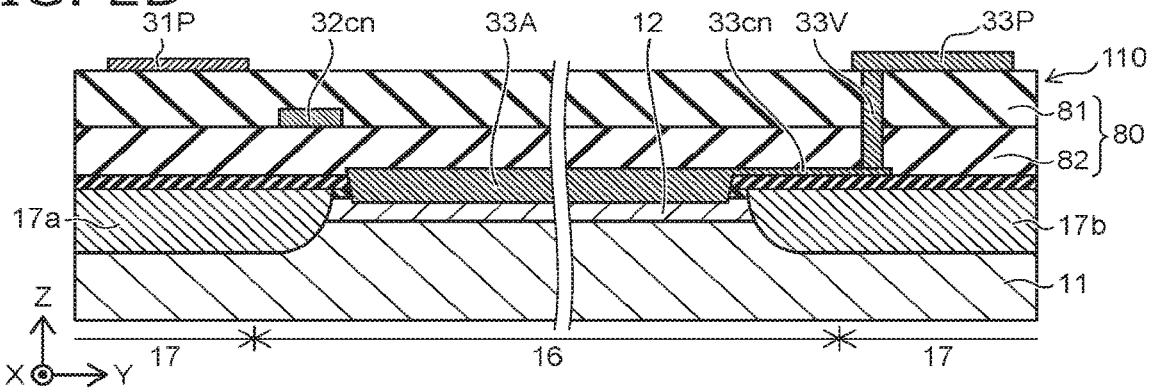

US 11,276,778 B2

SEMICONDUCTOR DEVICE

CROSS-REFERENCE TO RELATED APPLICATIONS

This application is based upon and claims the benefit of priority from Japanese Patent Application No. 2019-218728, filed on Dec. 3, 2019; the entire contents of which are incorporated herein by reference.

FIELD

Embodiments of the invention generally relate to a semiconductor device.

BACKGROUND

For example, it is desirable to improve the characteristics of a semiconductor device such as a transistor or the like.

BRIEF DESCRIPTION OF THE DRAWINGS

FIGS. 2A to 2D are schematic cross-sectional views illustrating the semiconductor device according to the first embodiment;

DETAILED DESCRIPTION

Figure 1:
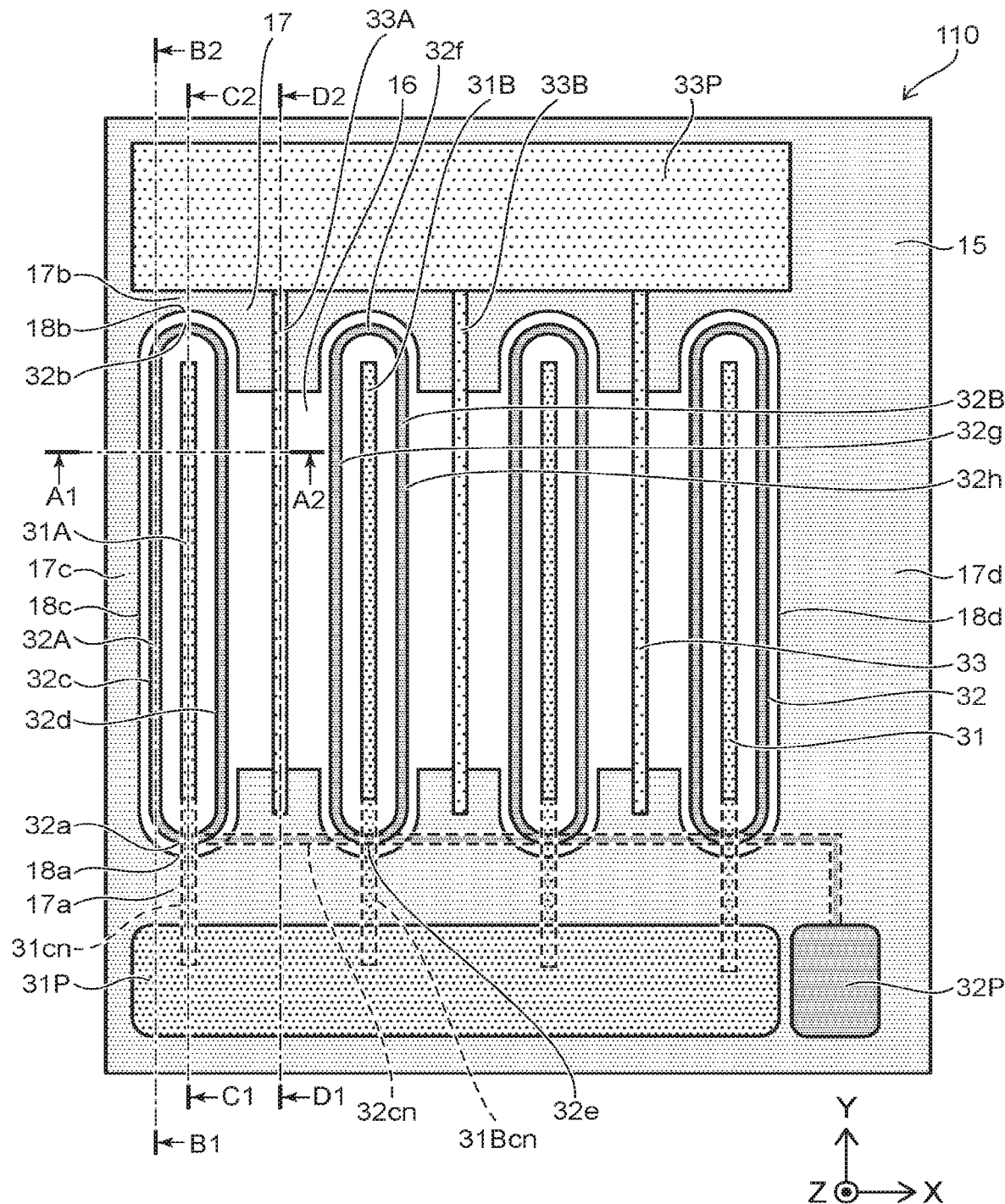
FIG. 1 is a schematic plan view illustrating a semiconductor device according to a first embodiment.

According to one embodiment, a semiconductor device includes a semiconductor member, a first source electrode, a first gate electrode, a first drain electrode, a source pad part, a first source connection part, and an insulating part. The semiconductor member includes a first semiconductor layer and a second semiconductor layer. The first semiconductor layer includes $Al_{x1}Ga_{1-x1}N$ ($0 \leq x1 < 1$). The second semiconductor layer includes $Al_{x2}Ga_{1-x2}N$ ($0 < x2 \leq 1$ and $x1 < x2$). The first source electrode extends along a first direction. The first gate electrode includes a first portion, a second portion, a third portion, and a fourth portion. The first source electrode is between the first portion and the second portion in the first direction. The first source electrode is between the third portion and the fourth portion in a second direction crossing the first direction. The third portion and the fourth portion extend along the first direction. A third direction is from the first semiconductor layer toward the second semiconductor layer and crosses a plane including the first and second directions. The first drain electrode extends along the first direction. The first source electrode is between the third portion and the first drain electrode in the second direction. The fourth portion is between the first source electrode and the first drain electrode in the second direction. The first source connection part electrically connects the first source electrode and the source pad part. The insulating part includes a first insulating region. At least a portion of the first insulating region is between the first portion and the first source connection part in the third direction.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously in an antecedent drawing are marked with like reference numerals, and a detailed description is omitted as appropriate.

First Embodiment

FIG. 1 is a schematic plan view illustrating a semiconductor device according to a first embodiment.

FIGS. 2A to 2D are schematic cross-sectional views illustrating the semiconductor device according to the first embodiment.

FIG. 2A is a line A1-A2 cross-sectional view of FIG. 1. FIG. 2B is a line B1-B2 cross-sectional view of FIG. 1. FIG. 2C is a line C1-C2 cross-sectional view of FIG. 1. FIG. 2D is a line D1-D2 cross-sectional view of FIG. 1.

As shown in FIGS. 1 and 2A, the semiconductor device 110 according to the embodiment includes a semiconductor member 15, a first source electrode 31A, a first gate electrode 32A, a first drain electrode 33A, a source pad part 31P, a first source connection part 31cn, and an insulating part 80.

As shown in FIG. 2A, the semiconductor member 15 includes a first semiconductor layer 11 and a second semiconductor layer 12. The first semiconductor layer 11 includes $Al_{x1}Ga_{1-x1}N$ ($0 \leq x1 < 1$). The first semiconductor layer 11 includes, for example, GaN. The second semiconductor layer 12 includes $Al_{x2}Ga_{1-x2}N$ ($0 < x2 \leq 1$ and $x1 < x2$). The second semiconductor layer 12 includes, for example, AlGaN. The composition ratio of Al in the second semiconductor layer 12 is, for example, not less than 0.1 and not more than 0.35.

For example, the second semiconductor layer 12 is provided on the first semiconductor layer 11. For example, the first semiconductor layer 11 may be provided on a silicon substrate, etc.

As shown in FIG. 1, the first source electrode 31A extends along a first direction. The first direction is, for example, a Y-axis direction.

As shown in FIG. 1, the first gate electrode 32A includes a first portion 32a, a second portion 32b, a third portion 32c, and a fourth portion 32d.

As shown in FIGS. 1 and 2C, the first source electrode 31A is between the first portion 32a and the second portion 32b in the first direction (the Y-axis direction).

As shown in FIG. 1, the first source electrode 31A is between the third portion 32c and the fourth portion 32d in a second direction. The second direction crosses the first direction. For example, the second direction is perpendicular to the first direction. The second direction is, for example, an X-axis direction. The third portion 32c and the fourth portion 32d extend along the first direction (the Y-axis direction).

As shown in FIG. 2A, a third direction is from the first semiconductor layer 11 toward the second semiconductor layer 12 and crosses a plane including the first and second directions. The plane that includes the first and second directions is, for example, an X-Y plane. For example, the third direction is perpendicular to the plane including the first and second directions. The third direction is, for example, a Z-axis direction. For example, the third direction corresponds to the stacking direction of the first and second semiconductor layers 11 and 12.

As shown in FIG. 1, the first drain electrode 33A extends along the first direction (the Y-axis direction). As shown in FIG. 1, the first source electrode 31A is between the third portion 32c and the first drain electrode 33A in the second direction (e.g., the X-axis direction). The fourth portion 32d is between the first source electrode 31A and the first drain electrode 33A in the second direction.

As shown in FIGS. 1 and 2C, the first source connection part 31cn electrically connects the first source electrode 31A and the source pad part 31P. In the example, the first source connection part 31cn is electrically connected to the first source electrode 31A by a source via conductive part 31V.

As shown in FIG. 2C, the insulating part 80 includes a first insulating region 81. At least a portion of the first insulating region 81 is between the first portion 32a and the first source connection part 31cn in the third direction (e.g., the Z-axis direction). As shown in FIGS. 1 and 2C, the first source connection part 31cn overlaps the first portion 32a of the first gate electrode 32A in the Z-axis direction. The first insulating region 81 electrically insulates the first source electrode 31A and the first portion 32a from each other.

The current that flows between the first source electrode 31A and the first drain electrode 33A can be controlled by controlling the potential of the first gate electrode 32A. For example, a two-dimensional electron gas is generated at the vicinity of the second semiconductor layer 12 of the first semiconductor layer 11. The state of the two-dimensional electron gas is controlled by controlling the potential of the first gate electrode 32A. The semiconductor device 110 is a transistor.

In the semiconductor device 110, the first source electrode 31A is between the first portion 32a and the second portion 32b of the first gate electrode 32A in the Y-axis direction. The first source electrode 31A is between the third portion 32c and the fourth portion 32d of the first gate electrode 32A in the X-axis direction. For example, the first gate electrode 32A exists in a path between the first source electrode 31A and the first drain electrode 33A. For example, the leakage current can be suppressed compared to when the first gate electrode 32A does not exist in the path between the first source electrode 31A and the first drain electrode 33A. In the embodiment, for example, the leakage current can be suppressed. According to the embodiment, a semiconductor device can be provided in which the characteristics can be improved.

As shown in FIG. 1, for example, in the first gate electrode 32A, the first portion 32a is continuous with the third portion 32c and the fourth portion 32d. For example, the first portion 32a may be continuous with at least one of the third portion 32c or the fourth portion 32d. For example, the second portion 32b is continuous with the third portion 32c and the fourth portion 32d. The second portion 32b may be continuous with at least one of the third portion 32c or the fourth portion 32d. For example, the leakage current can be more effectively suppressed.

For example, it is favorable for the first gate electrode 32A to surround the first source electrode 31A in the plane (the X-Y plane) described above. For example, the first source electrode 31A is provided in a region surrounded with the first gate electrode 32A in the X-Y plane. For example, the leakage current can be more effectively suppressed.

As shown in FIG. 1, the semiconductor member 15 includes an element region 16 and a peripheral region 17. The element region 16 is, for example, an active region. The peripheral region 17 is, for example, an inactive region. The peripheral region 17 is around the element region 16 in the plane (the X-Y plane) described above. For example, the element region 16 is surrounded with the peripheral region 17.

The crystallinity in the peripheral region 17 is less than the crystallinity in the element region 16. The crystallinity of the semiconductor member 15 degrades. In one example, the degradation of the crystallinity of the semiconductor member 15 can be observed by PL (Photo Luminescence). In one example of the PL evaluation, for example, when a He—Cd laser having a peak wavelength of 325 nm is irradiated, the excitation light spectrum of the peripheral region 17 is different from the excitation light spectrum of the element region 16. For example, the difference is observed between the intensities of the excitation light spectra of the peripheral region 17 and the element region 16 for an excitation light (a band edge emission) of about 360 nm. For example, the light intensity of the peripheral region 17 at about 360 nm is less than the light intensity of the element region 16 at about 360 nm. For example, a difference is observed between the intensities of the excitation light at the vicinity of about 530 nm (yellow luminescence) for the excitation light spectra of the peripheral region 17 and the element region 16. For example, the light intensity of the peripheral region 17 at about 530 nm is greater than the light intensity of the element region 16 at about 530 nm.

In one example, for example, the degradation can be observed by TEM (Transmission Electron Microscope). In one example of a TEM observation, a disturbance of the periodicity of the crystal lattice of the semiconductor member 15 is observed in the TEM observation of the peripheral region 17.

In one example, for example, the peripheral region 17 includes a first element, and the element region 16 substantially does not include the first element. The first element includes at least one selected from the group consisting of Ar, P, B, and N. The first element may be, for example, a heavy element. For example, the first element is introduced by ion implantation.

For example, the concentration of the first element in the peripheral region 17 is greater than the concentration of the first element in the element region 16. For example, the first element is introduced to the peripheral region 17. The crystallinity of the semiconductor member 15 in the region into which the first element is introduced degrades due to the impact damage of the first element. Due to the degradation of the crystallinity, a two-dimensional electron gas is substantially not generated in the peripheral region 17. The peripheral region 17 is, for example, an element separation region. On the other hand, the first element is substantially not introduced to the element region 16. Thereby, a two-dimensional electron gas is generated in the element region 16.

As shown in FIGS. 1, 2B, 2C, and 2D, the peripheral region 17 includes a first peripheral portion 17a and a second peripheral portion 17b. The direction from the first peripheral portion 17a toward the second peripheral portion 17b is along the first direction (the Y-axis direction).

As shown in FIGS. 1 and 2C, the semiconductor member 15 includes a first boundary 18a and a second boundary 18b. As shown in FIG. 2C, the first boundary 18a is between the element region 16 and the first peripheral portion 17a. The second boundary 18b is between the element region 16 and the second peripheral portion 17b. The direction from the first boundary 18a toward the second boundary 18b is along the first direction (the Y-axis direction).

As shown in FIGS. 1 and 2C, the position in the first direction (the Y-axis direction) of the first portion 32a is between the position in the first direction of the first boundary 18a and the position in the first direction of the second boundary 18b. The position in the first direction of the second portion 32b is between the position in the first direction of the first source electrode 31A and the position in the first direction of the second boundary 18b.

For example, the first gate electrode 32A and the first source electrode 31A are between the first boundary 18a and the second boundary 18b in the Y-axis direction. The first gate electrode 32A and the first source electrode 31A are provided inside the element region 16. As described above, the first gate electrode 32A is provided in a path between the first source electrode 31A and the first drain electrode 33A. The leakage current can be more reliably reduced by a structure of the peripheral region 17 such as that described above.

As shown in FIG. 1, the peripheral region 17 may include a third peripheral portion 17c and a fourth peripheral portion 17d. The direction from the third peripheral portion 17c toward the fourth peripheral portion 17d is along the second direction (e.g., the X-axis direction). The semiconductor member 15 includes a third boundary 18c and a fourth boundary 18d. The third boundary 18c is between the element region 16 and the third peripheral portion 17c. The fourth boundary 18d is between the element region 16 and the fourth peripheral portion 17d. The direction from the third boundary 18c toward the fourth boundary 18d is along the second direction (e.g., the X-axis direction).

The position in the second direction (the X-axis direction) of the third portion 32c is between the position in the second direction of the third boundary 18c and the position in the second direction of the fourth boundary 18d. The position in the second direction of the first drain electrode 33A is between the position in the second direction of the fourth portion 32d and the position in the second direction of the fourth boundary 18d.

For example, the first gate electrode 32A and the first source electrode 31A are between the third boundary 18c and the fourth boundary 18d in the X-axis direction. The first gate electrode 32A and the first source electrode 31A are provided inside the element region 16. The first gate electrode 32A is provided in a path between the first source electrode 31A and the first drain electrode 33A. The leakage current can be more reliably reduced by a structure of the peripheral region 17 such as that described above.

As shown in FIGS. 1 and 2C, the first peripheral portion 17a overlaps the source pad part 31P in the third direction (the Z-axis direction). A more stable operation is obtained by providing the source pad part 31P in the peripheral region 17 and not in the element region 16.

As shown in FIGS. 1 and 2C, the semiconductor device 110 may further include a drain pad part 33P. The drain pad part 33P is electrically connected to the first drain electrode 33A.

In the example as shown in FIG. 2D, the drain pad part 33P is electrically connected to a first drain interconnect part 33cn by a drain via conductive part 33V. The first drain interconnect part 33cn is electrically connected to the first drain electrode 33A.

As shown in FIG. 1, the position in the first direction (the Y-axis direction) of the second portion 32b of the first gate electrode 32A is between the position in the first direction of the first source electrode 31A and the position in the first direction of the drain pad part 33P. For example, the position in the first direction (the Y-axis direction) of the second boundary 18b is between the position in the first direction of the second portion 32b of the first gate electrode 32A and the position in the first direction of the drain pad part 33P.

For example, the drain pad part 33P overlaps the second peripheral portion 17b of the peripheral region 17. A more stable operation is obtained by providing the drain pad part 33P in the second peripheral portion 17b and not in the element region 16.

As shown in FIG. 1, the semiconductor device 110 may further include a gate pad part 32P. The gate pad part 32P is electrically connected to the first gate electrode 32A. In the example, the gate pad part 32P is electrically connected to the first gate electrode 32A by a first gate interconnect part 32cn. In one example, for example, the first gate interconnect part 32cn extends along the X-axis direction.

As shown in FIG. 2C, at least a portion of the first insulating region 81 is provided between the first gate interconnect part 32cn and the first source connection part 31cn. The gate pad part 32P and the first source electrode 31A are electrically insulated from each other by the first insulating region 81.

As shown in FIG. 1, the semiconductor device 110 may include the multiple source electrodes 31, multiple gate electrodes 32, and the multiple drain electrodes 33. The first source electrode 31A is one of the multiple source electrodes 31. The first gate electrode 32A is one of the multiple gate electrodes 32. The first drain electrode 33A is one of the multiple drain electrodes 33.

Another one (e.g., a second source electrode 31B) of the multiple source electrodes 31 may have a configuration similar to that of the first source electrode 31A. Another one (e.g., a second gate electrode 32B) of the multiple gate electrodes 32 may have a configuration similar to that of the first gate electrode 32A. Another one (e.g., a second drain electrode 33B) of the multiple drain electrodes 33 may have a configuration similar to that of the first drain electrode 33A.

As shown in FIG. 1, for example, the semiconductor device 110 further includes the second source electrode 31B, the second gate electrode 32B, and a second source connection part 31Bcn.

As shown in FIG. 1, the second source electrode 31B extends along the first direction (the Y-axis direction). The second gate electrode 32B includes a fifth portion 32e, a sixth portion 32f, a seventh portion 32g, and an eighth portion 32h. The second source electrode 31B is between the fifth portion 32e and the sixth portion 32f in the first direction (the Y-axis direction). The second source electrode 31B is between the seventh portion 32g and the eighth portion 32h in the second direction (the X-axis direction).

The seventh portion 32g and the eighth portion 32h extend along the first direction (the Y-axis direction).

As shown in FIG. 1, the seventh portion 32g is between the first drain electrode 33A and the eighth portion 32h in the second direction (the X-axis direction). The second source connection part 31Bcn electrically connects the second source electrode 31B and the source pad part 31P.

For example, the fifth portion 32e of the second gate electrode 32B has a configuration similar to that of the first portion 32a of the first gate electrode 32A. For example, the second source connection part 31Bcn has a configuration similar to the first source connection part 31cn. For example, similarly to the configuration described in reference to FIG. 2C, the first insulating region 81 is between the fifth portion 32e and the second source connection part 31Bcn in the third direction (the Z-axis direction).

In the example, the fifth portion 32e is directly continuous with the seventh and eighth portions 32g and 32h. For example, the fifth portion 32e may be directly continuous with at least one of the seventh portion 32g or the eighth portion 32h.

In the example, the sixth portion 32f is directly continuous with the seventh and eighth portions 32g and 32h. For example, the sixth portion 32f may be directly continuous with at least one of the seventh portion 32g or the eighth portion 32h.

For example, the second gate electrode 32B surrounds the second source electrode 31B in the plane (the X-Y plane) described above. The leakage current in the path between the second source electrode 31B and the first drain electrode 33A can be suppressed by such a second gate electrode 32B and such a second source electrode 31B.

In the semiconductor device 110 as described above, the drain pad part 33P that is electrically connected to the first drain electrode 33A is provided. The position in the first direction (the Y-axis direction) of the second portion 32b is between the position in the first direction of the first source electrode 31A and the position in the first direction of the drain pad part 33P. The position in the first direction of the sixth portion 32f is between the position in the first direction of the second source electrode 31B and the position in the first direction of the drain pad part 33P.

For example, the semiconductor device 110 is a lateral transistor having a multi-finger structure. For example, the multiple gate electrodes 32 and the multiple source electrodes 31 exist inside the closed system of the element region 16 inward of the element separation region (the peripheral region 17). For example, one of the multiple source electrodes 31 is inside a closed system surrounded with one of the multiple gate electrodes 32.

For example, all of the multiple drain electrodes 33 exist outside a closed system having the multiple gate electrodes 32 as the boundary line. In the semiconductor device 110, for example, the leakage current can be suppressed.

For example, at least a portion of the drain pad part 33P exists outside the element separation boundary (the peripheral region 17). A portion of the drain electrode 33 is in the element separation region (the peripheral region 17). For example, the drain pad part 33P and the multiple drain electrodes 33A are connected by the drain via conductive part 33V. The source pad part 31P is electrically connected to one of the multiple source electrodes 31 by the source via conductive part 31V. The gate pad part 32P is electrically connected to one of the multiple gate electrodes 32 via the first gate interconnect part 32cn.

As shown in FIG. 2A, the first semiconductor layer 11 includes a first partial region 11a, a second partial region 11b, a third partial region 11c, a fourth partial region 11d, a fifth partial region 11e, and a sixth partial region 11f. The second semiconductor layer 12 includes a first semiconductor portion 12a and a second semiconductor portion 12b. The second partial region 11b is between the first partial region 11a and the fifth partial region 11e in the second direction (the X-axis direction). The third partial region 11c is between the first partial region 11a and the second partial region 11b in the second direction. The fourth partial region 11d is between the third partial region 11c and the second partial region 11b in the second direction. The sixth partial region 11f is between the second partial region 11b and the fifth partial region 11e in the second direction.

The direction from the first partial region 11a toward the third portion 32c is along the third direction (the Z-axis direction). The direction from the second partial region 11b toward the fourth portion 32d is along the third direction. The direction from the third partial region 11c toward the first source electrode 31A is along the third direction. The direction from the fourth partial region 11d toward the first semiconductor portion 12a is along the third direction. The direction from the fifth partial region 11e toward the first drain electrode 33A is along the third direction. The direction from the sixth partial region 11f toward the second semiconductor portion 12b is along the third direction.

For example, the semiconductor device 110 may further include a first insulating film 85F. The first insulating film 85F is provided between the first semiconductor layer 11 and the first gate electrode 32A. The first insulating film 85F functions as a gate insulating film. The first insulating film 85F includes, for example, silicon oxide, etc. The first insulating film 85F may have a stacked structure that includes multiple films of different materials. For example, the first insulating film 85F may have a stacked structure that includes an aluminum nitride film and a silicon oxide film.

In the example as shown in FIG. 2A, the second semiconductor layer 12 is between the third portion 32c and the fourth portion 32d. The semiconductor device 110 is, for example, a normally-off semiconductor device. For example, a portion of the first semiconductor layer 11 may be between the third portion 32c and the fourth portion 32d.

A second insulating film 85G may be provided as shown in FIG. 2A. The second semiconductor layer 12 is provided between the first semiconductor layer 11 and the second insulating film 85G. The second insulating film 85G includes, for example, silicon nitride, etc. For example, the second insulating film 85G functions as a protective film of the second semiconductor layer 12.

As shown in FIGS. 2A to 2D, the insulating part 80 may further include a second insulating region 82. For example, the second insulating region 82 is between the first portion 32a and a portion of the first gate interconnect part 32cn.

An example of a method for manufacturing the semiconductor device 110 will now be described.

FIGS. 3A to 3C and FIGS. 4A to 4C are schematic cross-sectional views illustrating the method for manufacturing the semiconductor device according to the first embodiment.

Figure 3A:
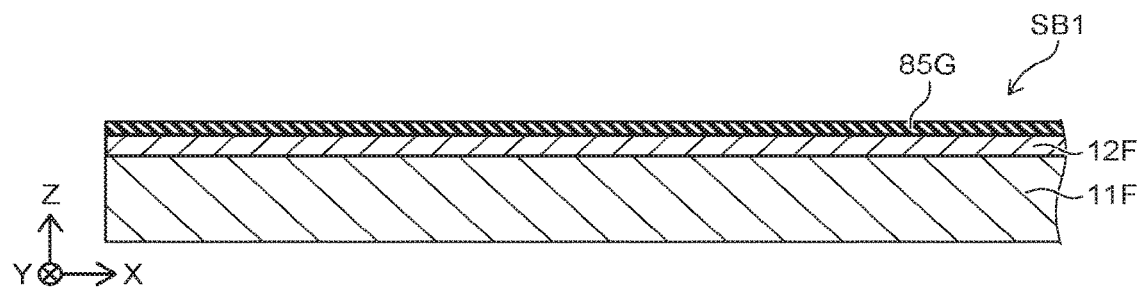
FIGS. 3A to 3C are schematic cross-sectional views illustrating the method for manufacturing the semiconductor device according to the first embodiment.

A structure body SB1 is prepared as shown in FIG. 3A. The structure body SB1 includes a first semiconductor film 11F used to form the first semiconductor layer 11, and a second semiconductor film 12F used to form the second semiconductor layer 12. In the example, the structure body SB1 includes the second insulating film 85G. The second semiconductor film 12F is between the first semiconductor film 11F and the second insulating film 85G.

Figure 3B:
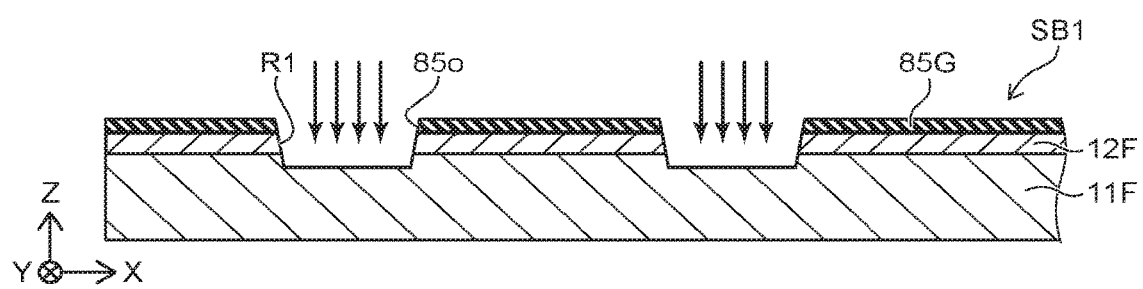

As shown in FIG. 3B, an opening 85o is provided in the second insulating film 85G. A portion of the second semiconductor film 12F and a portion of the first semiconductor film 11F are removed at the opening 85o. For example, the removal is performed by RIE (Reactive Ion Etching), etc. A recess R1 is formed thereby. The first semiconductor layer 11 is formed from the first semiconductor film 11F, and the second semiconductor layer 12 is formed from the second semiconductor film 12F. The semiconductor member 15 is formed thereby.

Figure 3C:
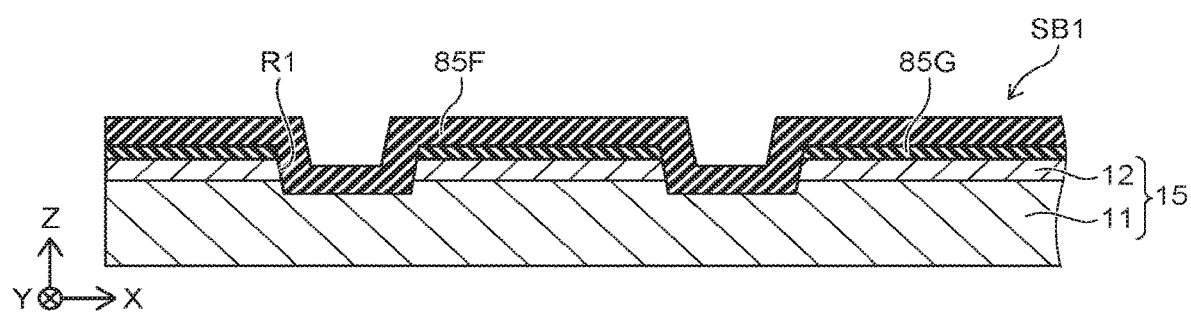

The first insulating film 85F is formed as shown in FIG. 3C. For example, a silicon oxide film or the like is formed as the first insulating film 85F. Subsequently, heat treatment (PDA (Post Deposition Annealing)) is performed.

Figure 4A:
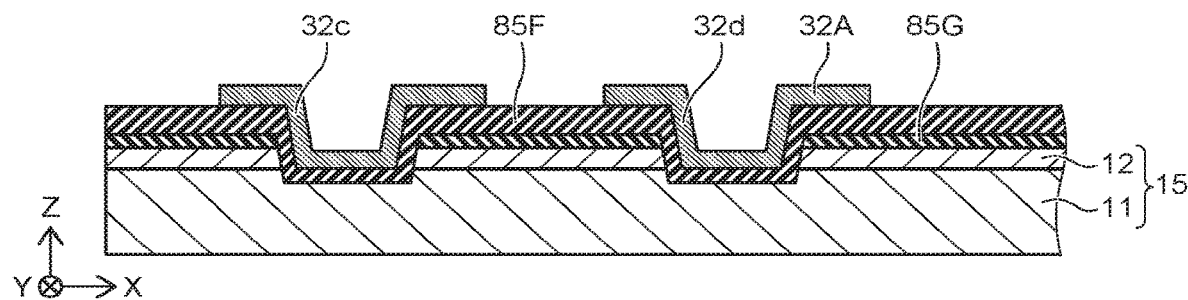
FIGS. 4A to 4C are schematic cross-sectional views illustrating the method for manufacturing the semiconductor device according to the first embodiment.

As shown in FIG. 4A, the first gate electrode 32A is formed by forming a conductive film. FIG. 4A shows the third portion 32c and the fourth portion 32d. The conductive film that is used to form the first gate electrode 32A includes, for example, at least one selected from the group consisting of Ti, W, Ni, Pt, Au, and Ta.

Figure 4B:
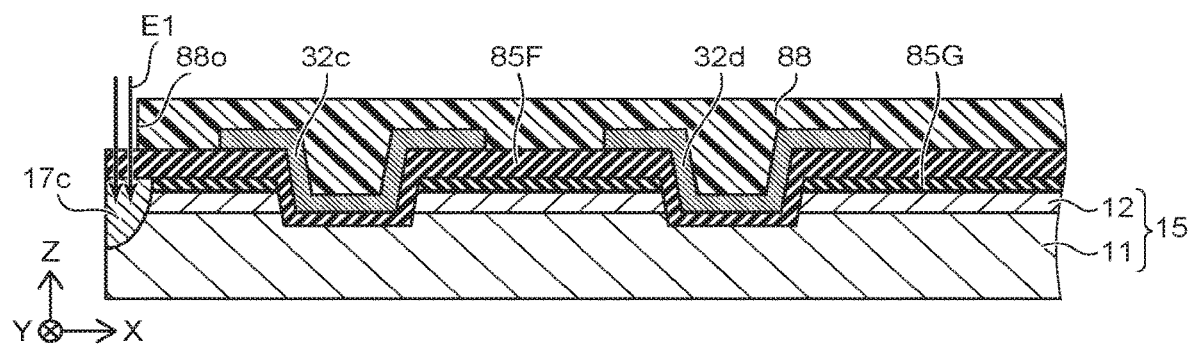

A mask 88 is formed as shown in FIG. 4B. The mask 88 is, for example, a resist. The mask 88 has an opening 88o. A first element E1 is introduced to the semiconductor member 15 exposed at the opening 88o. For example, the first element is ion-implanted. The first element E1 includes, for example, at least one selected from the group consisting of Ar, P, B, and N. High insulation properties of the semiconductor member 15 are obtained in the portion into which the first element E1 is introduced. The high insulation properties are caused by the introduction of the first element E1 that reduces the crystallinity of the semiconductor member 15 so that a two-dimensional electron gas is not generated. The portion into which the first element E1 is introduced is used to form the peripheral region 17. FIG. 4B illustrates the third peripheral portion 17c.

Figure 4C:
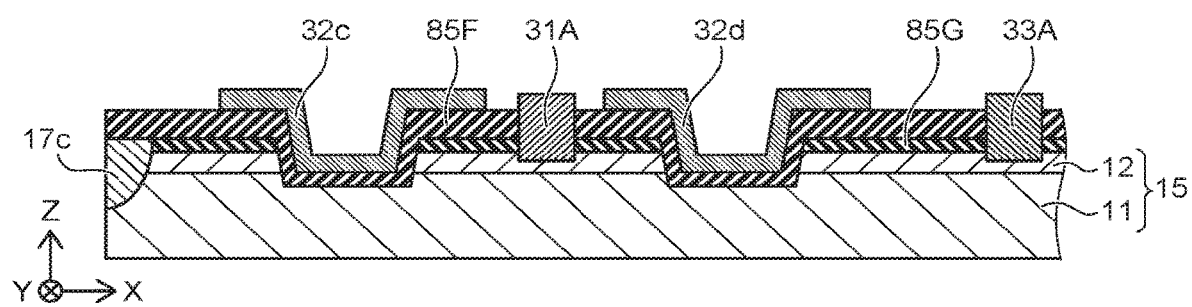

The source electrode 31 (e.g., the first source electrode 31A) and the drain electrode 33 (e.g., the first drain electrode 33A) are formed as shown in FIG. 4C. Subsequently, the insulating part 80, the via conductive parts, the pad parts, etc., are formed. The semiconductor device 110 is obtained thereby.

For example, a high-quality first insulating film 85F is obtained by heat treatment (PDA). In the manufacturing method described above, if the heat treatment (the PDA) is performed after the introduction of the first element E1, there is a possibility that the crystallinity of the semiconductor member 15 may be recovered, and the insulative properties of the region into which the first element E1 is introduced may degrade. To obtain good insulation properties, the introduction of the first element E1 is performed after the heat treatment.

It is favorable for the gate electrode 32 to be formed by forming a conductive film directly after the heat treatment (the PDA) after forming the first insulating film 85F. Thereby, the adhesion of an impurity to the first insulating film 85F can be suppressed, and good characteristics are obtained.

Accordingly, the introduction of the first element E1 is performed after forming the conductive film used to form the gate electrode 32. If a conductive film is exposed from under the mask 88 in the processing of introducing the first element E1, there is a possibility that the apparatus for the processing may be contaminated by metal elements included in the conductive film. The metal contamination may increase the number of particles in the apparatus and reduce the manufacturing yield. Therefore, it is favorable for the conductive films not to be exposed from under the mask 88 in the processing of introducing the first element E1.

The configuration of the boundary between the peripheral region 17 and the element region 16 is different according to the configuration of the mask 88 (the configuration of the opening 88o). Examples of the configuration of the boundary between the peripheral region 17 and the element region 16 will now be described.

Figure 5A:
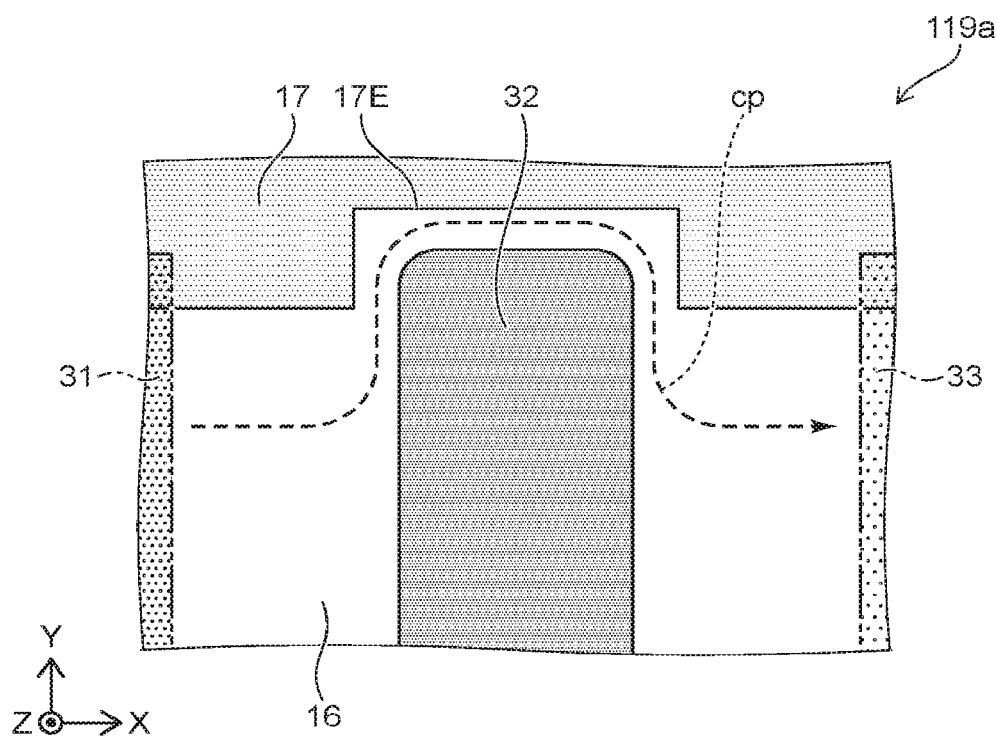
FIGS. 5A and 5B are schematic plan views illustrating semiconductor devices.
Figure 5B:
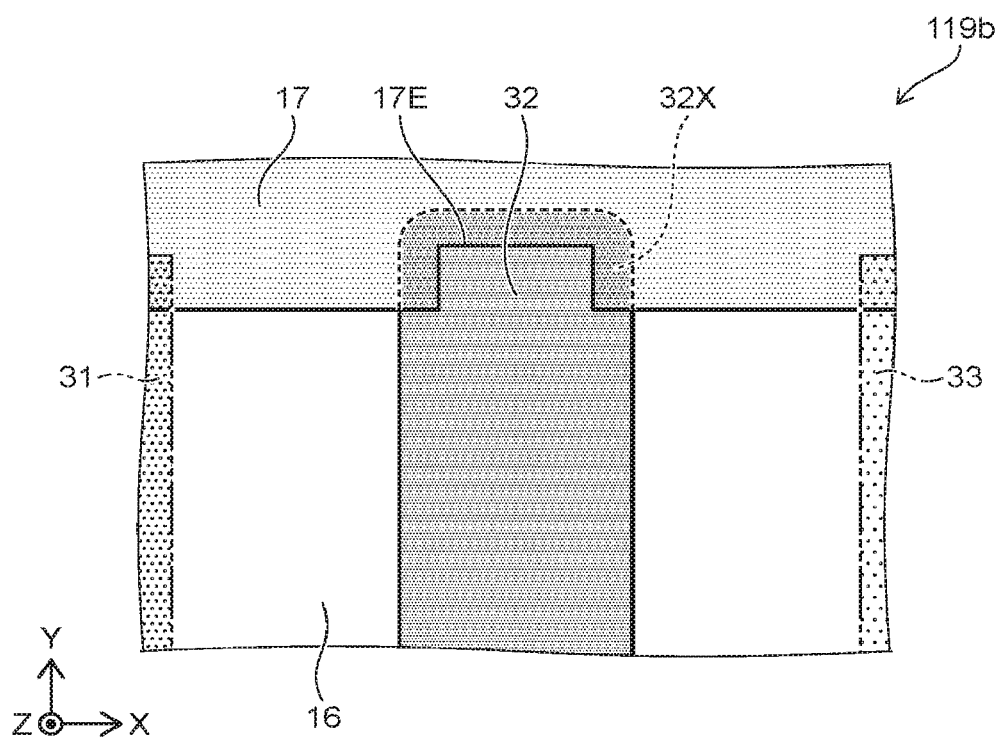

FIGS. 5A and 5B are schematic plan views illustrating semiconductor devices.

In a semiconductor device 119a illustrated in FIG. 5A, the gate electrode 32 is inward of a boundary 17E between the peripheral region 17 and the element region 16. The gate electrode 32 is separated from the boundary 17E. A portion of the element region 16 is between the gate electrode 32 and the boundary 17E. In such a case, charge (e.g., electrons) can move along a path cp between the source electrode 31 and the drain electrode 33. Therefore, the leakage current is large in the semiconductor device 119a.

In the semiconductor device 119a, the gate electrode 32 is inward of the boundary 17E. The gate electrode 32 is covered with the mask 88 in the processing of introducing the first element E1. Therefore, for the semiconductor device 119a, the contamination of the processing apparatus in the processing of introducing the first element E1 is suppressed.

In a semiconductor device 119b illustrated in FIG. 5B, a portion 32X of the gate electrode 32 is outward of the boundary 17E between the peripheral region 17 and the element region 16. The gate electrode 32 overlaps the peripheral region 17. The leakage current is suppressed in the semiconductor device 119b because the path cp between the source electrode 31 and the drain electrode 33 does not exist.

In the semiconductor device 119b, the portion 32X of the gate electrode 32 is outward of the boundary 17E. The portion 32X of the gate electrode 32 is not covered with the mask 88 in the processing of introducing the first element E1. Therefore, for the semiconductor device 119b, contamination of the processing apparatus occurs in the processing of introducing the first element E1.

Figure 6A:
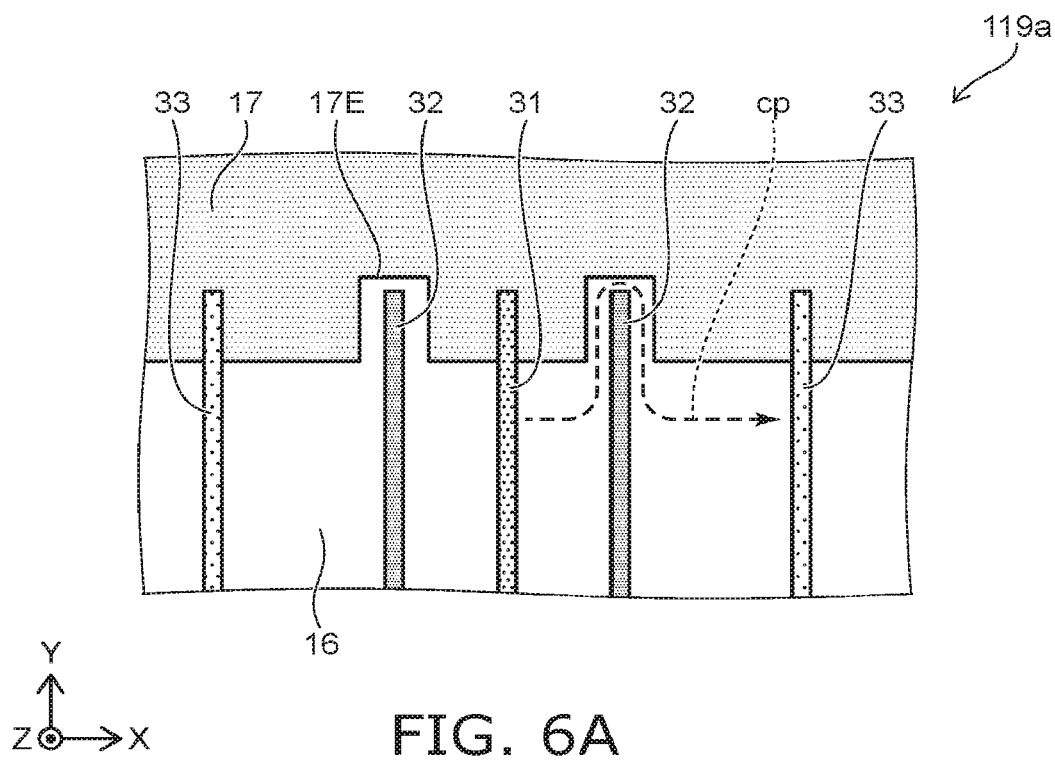
FIGS. 6A and 6B are schematic plan views illustrating the semiconductor devices.
Figure 6B:
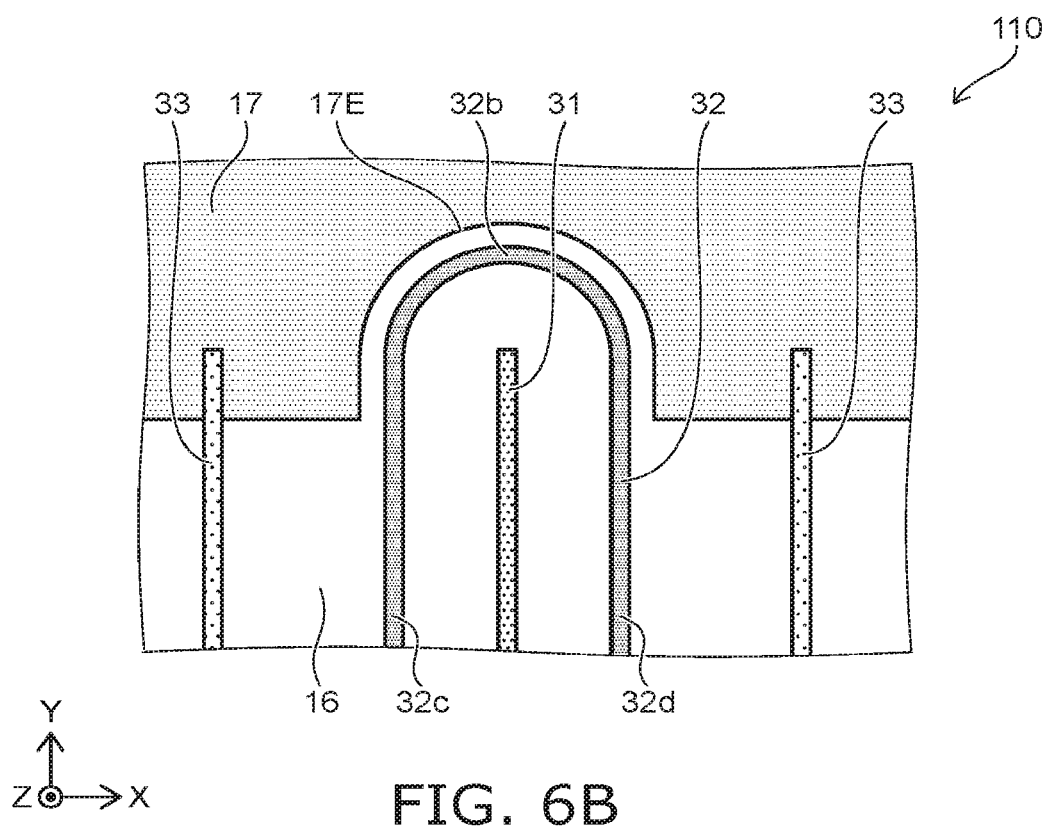

FIGS. 6A and 6B are schematic plan views illustrating the semiconductor devices.

The multiple gate electrodes 32, the multiple drain electrodes 33, and the source electrode 31 are provided in the semiconductor device 119a illustrated in FIG. 6A. The gate electrode 32 is separated from the boundary 17E in the semiconductor device 119a. The charge can move along the path cp between the source electrode 31 and the drain electrode 33, and the leakage current is large. For the semiconductor device 119a as described above, the contamination of the processing apparatus in the processing of introducing the first element E1 is suppressed.

In the semiconductor device 110 illustrated in FIG. 6B, a portion (in the example, the second portion 32b) of the gate electrode 32 is between the source electrode 31 and the boundary 17E. For example, the gate electrode 32 (the second portion 32b, the third portion 32c, the fourth portion 32d, etc.) is provided around the source electrode 31. The boundary 17E is between the peripheral region 17 and the element region 16 around the gate electrode 32. The gate electrode 32 is between the source electrode 31 and the drain electrode 33. Therefore, the leakage current is suppressed. In the semiconductor device 110, the gate electrode 32 is in the element region 16; therefore, the gate electrode 32 is covered with a mask in the processing of introducing the first element E1. For the semiconductor device 110, the contamination of the processing apparatus is suppressed.

Figure 7A:
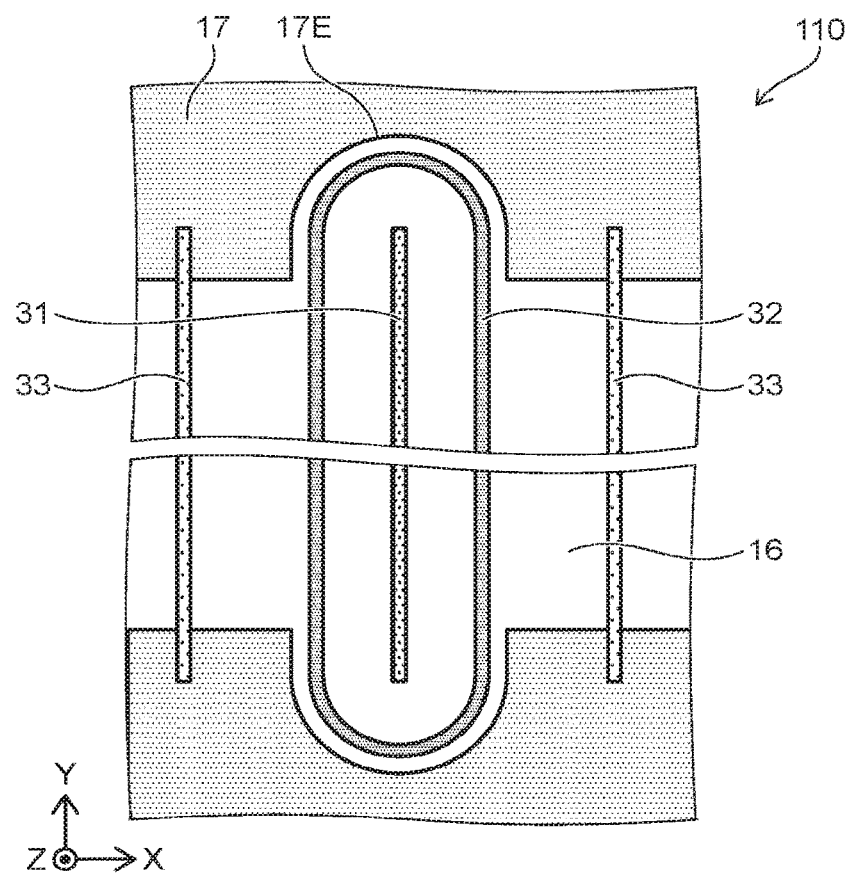
FIGS. 7A and 7B are schematic plan views illustrating semiconductor devices according to the first embodiment.
Figure 7B:
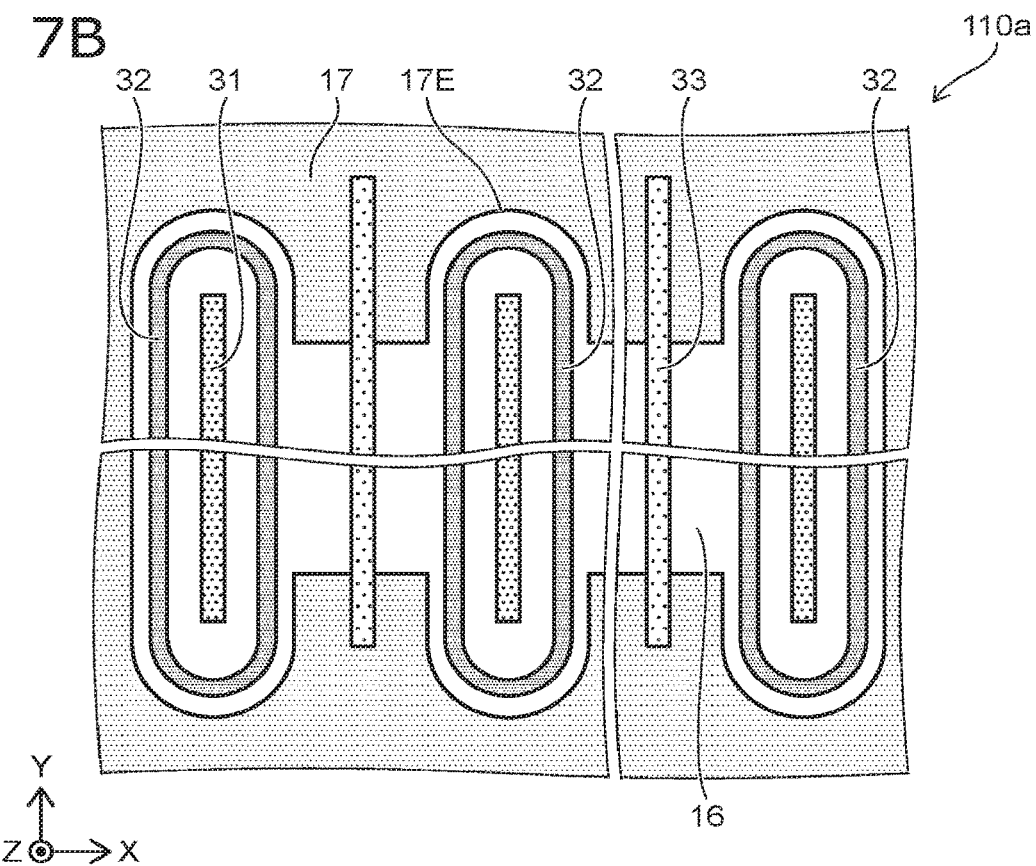

FIGS. 7A and 7B are schematic plan views illustrating semiconductor devices according to the first embodiment.

In the semiconductor device 110 as shown in FIG. 7A, for example, the gate electrode 32 surrounds the source electrode 31. The gate electrode 32 is separated from the boundary 17E.

In a semiconductor device 110a shown in FIG. 7B, one of the multiple gate electrodes 32 is provided at one terminal region of the element region 16 in the X-axis direction. Another one of the multiple gate electrodes 32 is provided at another terminal region of the element region 16 in the X-axis direction.

FIGS. 8A to 8D are schematic cross-sectional views illustrating a semiconductor device according to the first embodiment.

Figure 8A:
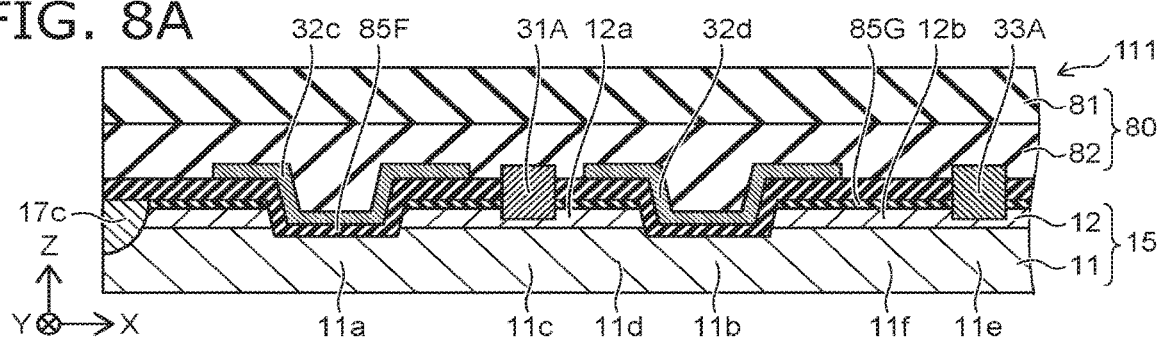
FIGS. 8A to 8D are schematic cross-sectional views illustrating a semiconductor device according to the first embodiment.
Figure 8B:
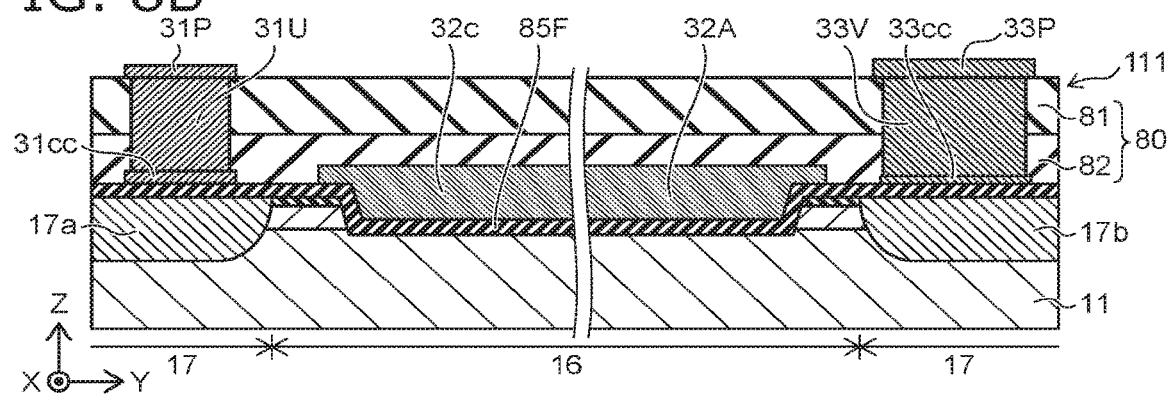
Figure 8C:
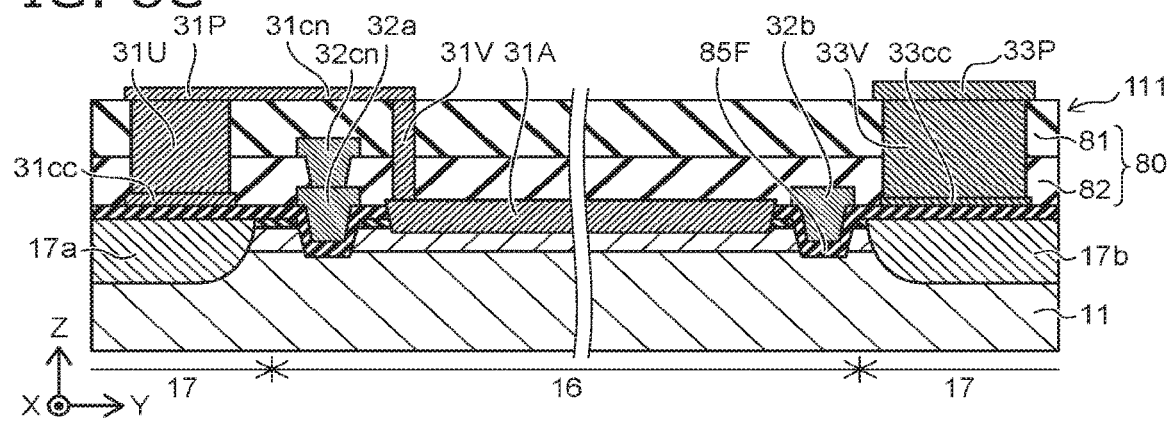
Figure 8D:
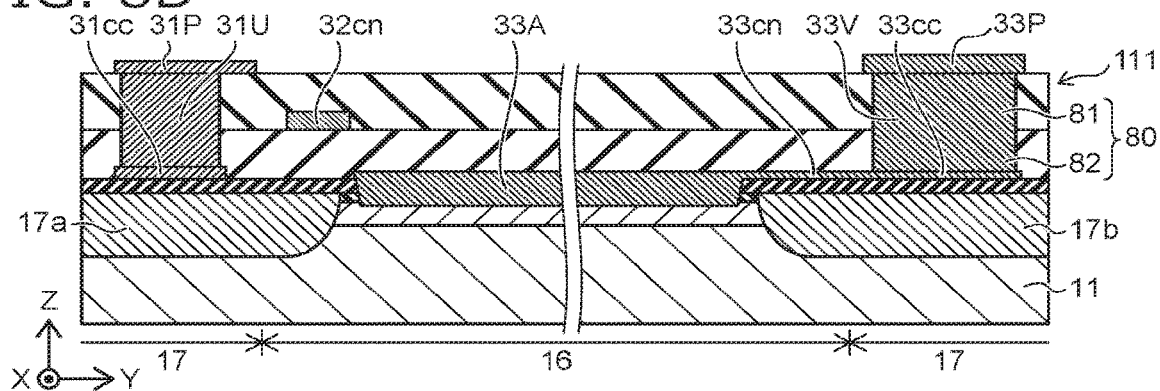

FIG. 8A corresponds to a line A1-A2 cross section of FIG. 1. FIG. 8B corresponds to a line B1-B2 cross section of FIG. 1. FIG. 8C corresponds to a line C1-C2 cross section of FIG. 1. FIG. 8D corresponds to a line D1-D2 cross section of FIG. 1.

As shown in FIGS. 8B to 8D, a source connection interconnect 31cc is provided in the semiconductor device 111. The source connection interconnect 31cc is in the peripheral region 17. The source connection interconnect 31cc is connected to the source pad part 31P via a source connection via conductive part 31U.

A drain connection interconnect 33cc is provided as shown in FIGS. 8B to 8D. The drain connection interconnect 33cc is in the peripheral region 17. As shown in FIG. 8D, the drain connection interconnect 33cc is electrically connected to the drain electrode 33 (e.g., the first drain electrode 33A) via the first drain interconnect part 33cn. The drain connection interconnect 33cc is connected to the drain pad part 33P by the drain via conductive part 33V. The drain via conductive part 33V has a band configuration extending in the X-axis direction.

In the semiconductor device 111, for example, a low resistance is obtained for the conductive part including the source pad part 31P and the source electrode 31. In the semiconductor device 111, for example, a low resistance is obtained for the conductive part including the drain pad part 33P and the drain electrode 33.

FIGS. 9A to 9D are schematic cross-sectional views illustrating a semiconductor device according to the first embodiment.

Figure 9A:
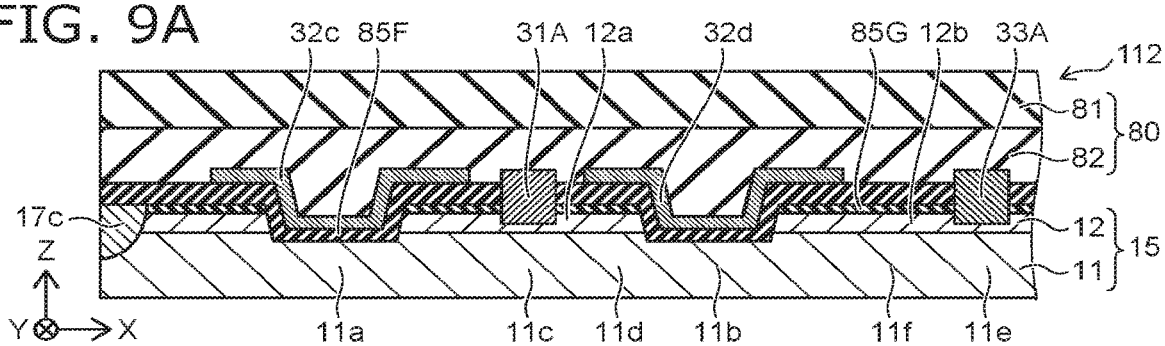
FIGS. 9A to 9D are schematic cross-sectional views illustrating a semiconductor device according to the first embodiment.
Figure 9B:
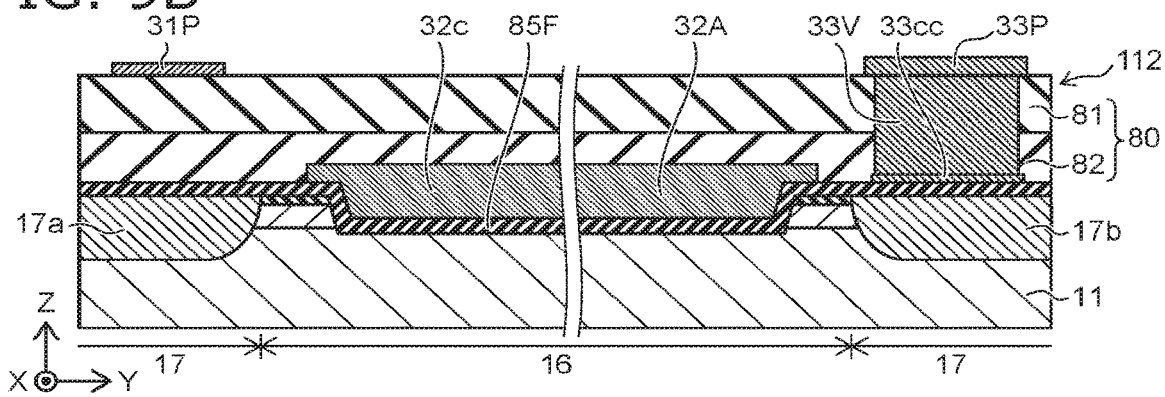
Figure 9C:
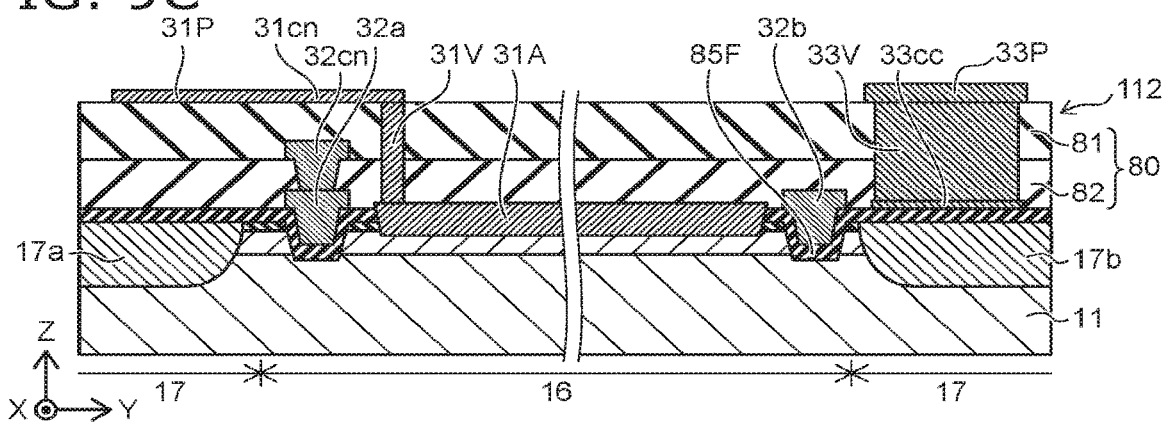
Figure 9D:
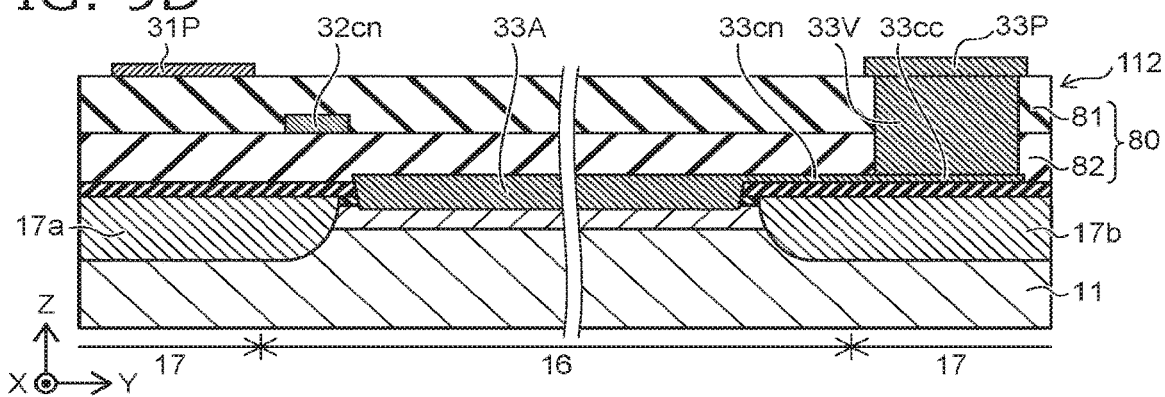

FIG. 9A corresponds to a line A1-A2 cross section of FIG. 1. FIG. 9B corresponds to a line B1-B2 cross section of FIG. 1. FIG. 9C corresponds to a line C1-C2 cross section of FIG. 1. FIG. 9D corresponds to a line D1-D2 cross section of FIG. 1.

As shown in FIGS. 9B to 9D, the drain connection interconnect 33cc is provided in the semiconductor device 112. The drain connection interconnect 33cc is connected to the drain pad part 33P by the drain via conductive part 33V. For example, a low resistance is obtained for the conductive part including the drain pad part 33P and the drain electrode 33.

Figure 10:
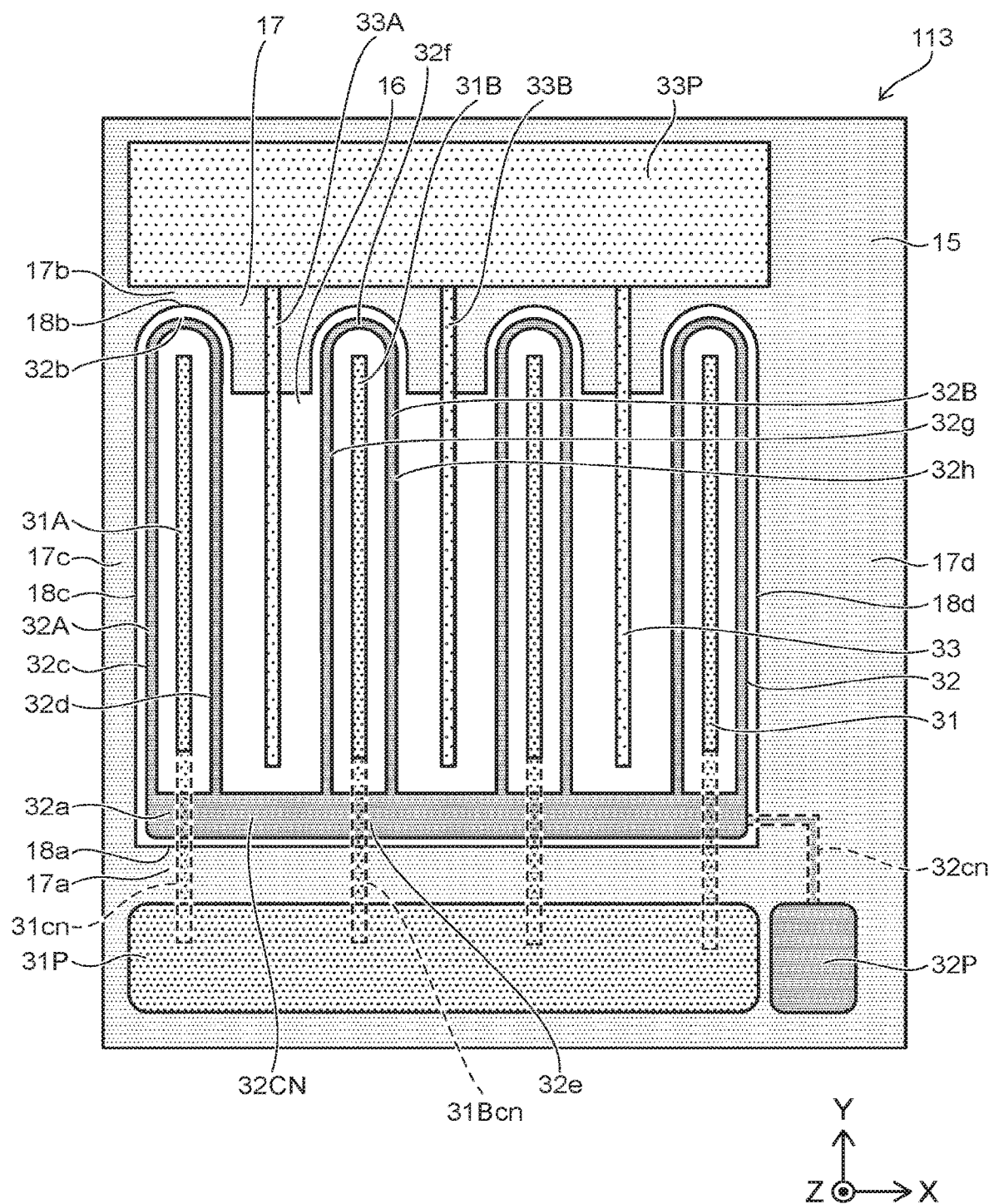
FIG. 10 is a schematic plan view illustrating a semiconductor device according to the first embodiment.

FIG. 10 is a schematic plan view illustrating a semiconductor device according to the first embodiment.

As shown in FIG. 10, the semiconductor device 113 according to the embodiment includes the semiconductor member 15, the first source electrode 31A, the second source electrode 31B, the first gate electrode 32A, the second gate electrode 32B, the first drain electrode 33A, the source pad part 31P, and the first source connection part 31cn. The semiconductor device 113 further includes a gate connection member 32CN and the insulating part 80 (referring to FIG. 2C). The configurations of the first and second gate electrodes 32A and 32B of the semiconductor device 113 are different from those of the semiconductor device 110. Otherwise, for example, the configuration of the semiconductor device 113 is similar to the configuration of the semiconductor device 110. Examples of the first gate electrode 32A, the second gate electrode 32B, and the gate connection member 32CN of the semiconductor device 113 will now be described.

In the semiconductor device 113, the first gate electrode 32A includes the first to fourth portions 32a to 32d. In such a case as well, the first source electrode 31A is between the first portion 32a and the second portion 32b in the first direction (the Y-axis direction). The first source electrode 31A is between the third portion 32c and the fourth portion 32d in the second direction (e.g., the X-axis direction). The third portion 32c and the fourth portion 32d extend along the first direction (the Y-axis direction).

The second gate electrode 32B includes the fifth to eighth portions 32e to 32h. The second source electrode 31B is between the fifth portion 32e and the sixth portion 32f in the first direction (the Y-axis direction). The second source electrode 31B is between the seventh portion 32g and the eighth portion 32h in the second direction (e.g., the X-axis direction). The seventh portion 32g and the eighth portion 32h extend along the first direction (the Y-axis direction). The seventh portion 32g is between the first drain electrode 33A and the eighth portion 32h in the second direction. The gate connection member 32CN electrically connects the fifth portion 32e to the first portion 32a.

In the semiconductor device 113 as well, for example, the first gate electrode 32A exists in the path cp between the first source electrode 31A and the first drain electrode 33A. For example, the second gate electrode 32B exists in the path cp between the second source electrode 31B and the first drain electrode 33A. For example, the leakage current can be suppressed. A semiconductor device can be provided in which the characteristics can be improved. In the semiconductor device 113 as well, the contamination of the processing apparatus used in the processing of introducing the first element E1 is suppressed.

In the semiconductor device 113 as well, the first source connection part 31cn electrically connects the first source electrode 31A and the source pad part 31P. As described in reference to FIG. 2C, at least a portion of the first insulating region 81 of the insulating part 80 is between the first portion 32a and the first source connection part 31cn in the third direction (the Z-axis direction).

In the semiconductor device 113, the first gate electrode 32A surrounds the first source electrode 31A in the X-Y plane. The second gate electrode 32B surrounds the second source electrode 31B in the X-Y plane. For example, the leakage current can be more effectively suppressed.

Second Embodiment

Figure 11:
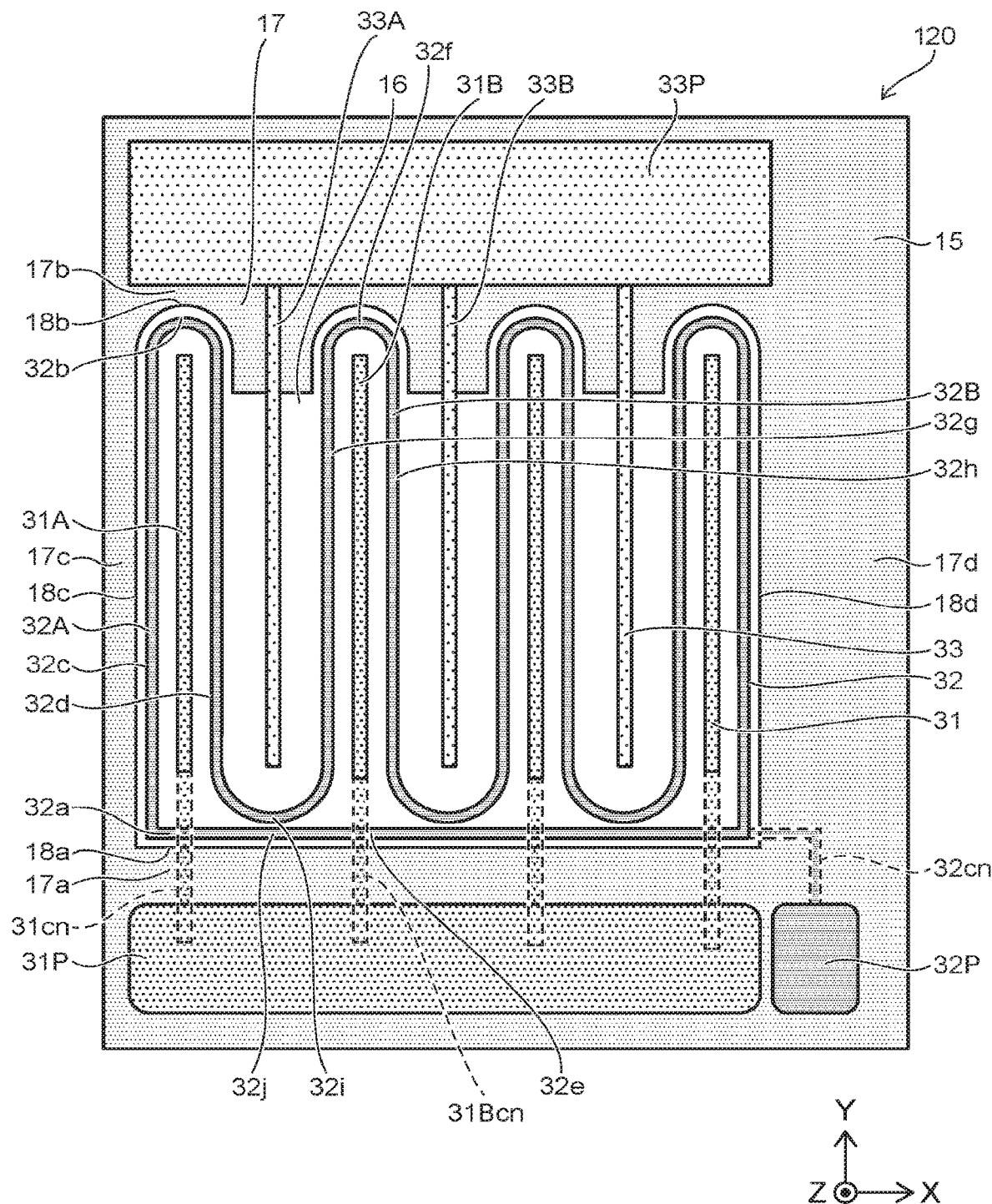
FIG. 11 is a schematic plan view illustrating a semiconductor device according to a second embodiment.

FIG. 11 is a schematic plan view illustrating a semiconductor device according to a second embodiment.

As shown in FIG. 11, the semiconductor device 120 according to the second embodiment includes the semiconductor member 15, the first source electrode 31A, the second source electrode 31B, the first gate electrode 32A, the second gate electrode 32B, the first drain electrode 33A, the source pad part 31P, and the first source connection part 31cn. The semiconductor device 113 further includes the insulating part 80 (referring to FIG. 2C). The configurations of the first and second gate electrodes 32A and 32B of the semiconductor device 120 are different from those of the semiconductor device 110. Otherwise, for example, the configuration of the semiconductor device 120 is similar to the configuration of the semiconductor device 110. Examples of the first and second gate electrodes 32A and 32B of the semiconductor device 120 will now be described.

In the semiconductor device 120, the first gate electrode 32A includes the first to ninth portions 32a to 32i. In such a case as well, the first source electrode 31A is between the first portion 32a and the second portion 32b in the first direction (the Y-axis direction). The first source electrode 31A is between the third portion 32c and the fourth portion 32d in the second direction (e.g., the X-axis direction). The third portion 32c and the fourth portion 32d extend along the first direction (the Y-axis direction). The first source electrode 31A extends along the first direction (the Y-axis direction).

The second source electrode 31B is between the fifth portion 32e and the sixth portion 32f in the first direction (the Y-axis direction). The second source electrode 31B is between the seventh portion 32g and the eighth portion 32h in the second direction (e.g., the X-axis direction). The seventh portion 32g and the eighth portion 32h extend along the first direction. The seventh portion 32g is between the first drain electrode 33A and the eighth portion 32h in the second direction. The ninth portion 32i is connected to the fourth and seventh portions 32d and 32g. The second source electrode 31B extends along the first direction (the Y-axis direction).

For example, the first portion 32a is connected to the fifth portion 32e. In such a case as shown in FIG. 11, the first gate electrode 32A may be considered to include a tenth portion 32j, and the tenth portion 32j may be considered to connect the first portion 32a and the fifth portion 32e. Or, the first portion 32a may be considered to extend to be connected to the fifth portion 32e. Or, the fifth portion 32e may be considered to extend to be connected to the first portion 32a.

In the semiconductor device 120, the first gate electrode 32A exists in the path cp between the first drain electrode 33A and the multiple source electrodes 31 (the first source electrode 31A and the second source electrode 31B). For example, the leakage current can be suppressed. A semiconductor device can be provided in which the characteristics can be improved. In the semiconductor device 120 as well, the contamination of the processing apparatus used in the processing of introducing the first element E1 is suppressed.

In the semiconductor device 120, for example, the first gate electrode 32A surrounds the first source electrode 31A and the second source electrode 31B in the X-Y plane. For example, the leakage current can be more effectively suppressed.

Similarly to the configuration described in reference to FIG. 2C, in the semiconductor device 120, the first source connection part 31cn electrically connects the first source electrode 31A and the source pad part 31P. As described in reference to FIG. 2C, at least a portion of the first insulating region 81 of the insulating part 80 is between the first portion 32a and the first source connection part 31cn in the third direction (the Z-axis direction).

Similarly to the configuration of the first source connection part 31cn described in reference to FIG. 2C, in the semiconductor device 120, the second source connection part 31Bcn electrically connects the second source electrode 31B and the source pad part 31P. Similarly to the configuration of the first insulating region 81 described in reference to FIG. 2C, in the semiconductor device 120, the first insulating region 81 is between the fifth portion 32e and the second source connection part 31Bcn in the third direction (the Z-axis direction).

As shown in FIG. 11, the drain pad part 33P is provided in the semiconductor device 120. The drain pad part 33P is electrically connected to the drain electrode 33 (e.g., the first drain electrode 33A). The drain pad part 33P is provided in the peripheral region 17.

The position in the first direction (the Y-axis direction) of the first drain electrode 33A is between the position in the first direction of the ninth portion 32i and the position in the first direction of the drain pad part 33P. For example, the first drain electrode 33A is outside the region surrounded with the first gate electrode 32A.

In the semiconductor device 120, the position in the first direction (the Y-axis direction) of the second portion 32b is between the position in the first direction of the first source electrode 31A and the position in the first direction of the drain pad part 33P. The position in the first direction of the sixth portion 32f is between the position in the first direction of the second source electrode 31B and the position in the first direction of the drain pad part 33P.

Figure 12:
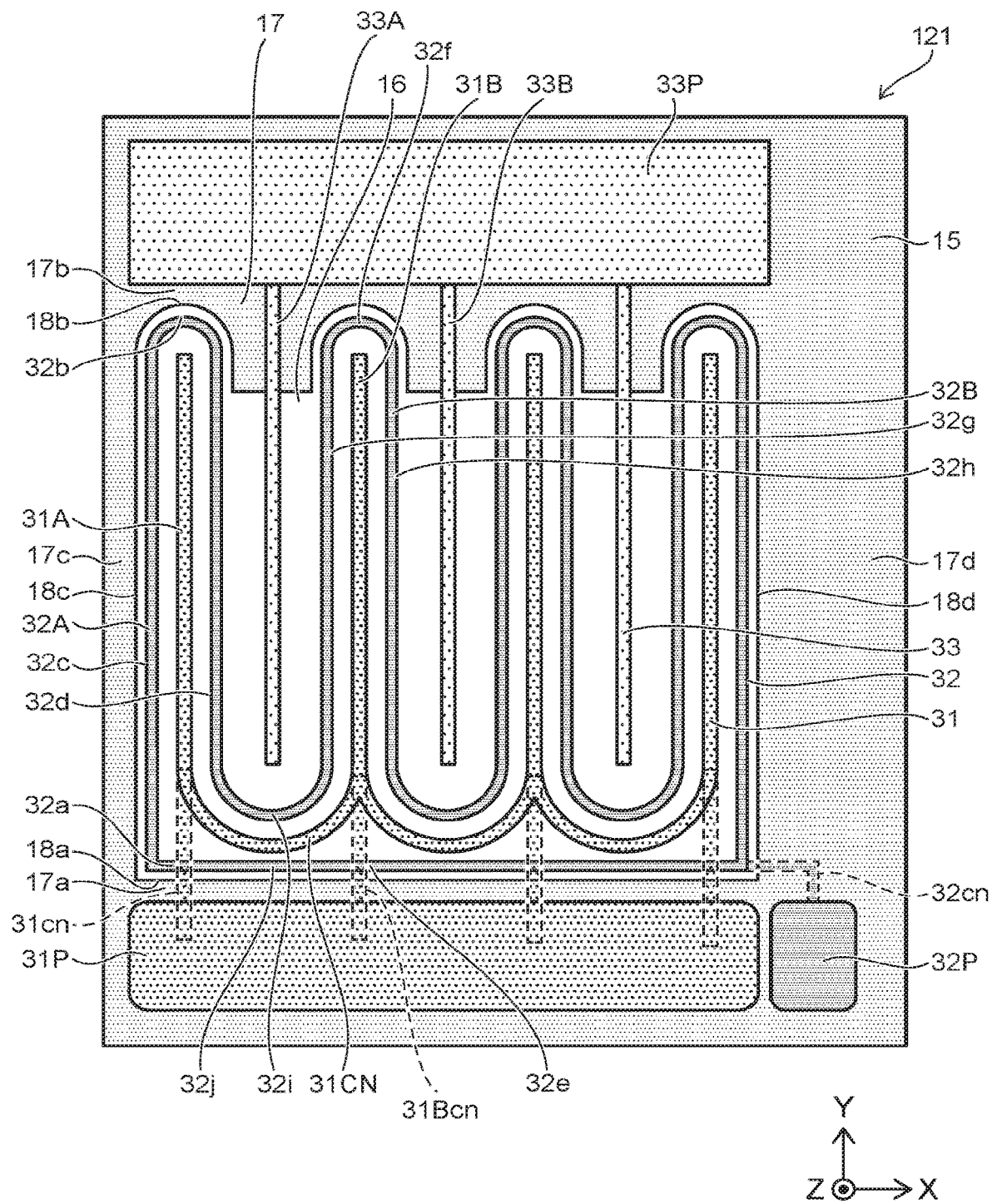
FIG. 12 is a schematic plan view illustrating a semiconductor device according to the second embodiment.

FIG. 12 is a schematic plan view illustrating a semiconductor device according to the second embodiment.

As shown in FIG. 12, the semiconductor device 121 according to the second embodiment includes the semiconductor member 15, the first source electrode 31A, the second source electrode 31B, the first gate electrode 32A, the second gate electrode 32B, the first drain electrode 33A, the source pad part 31P, the first source connection part 31cn, and a source connection member 31CN. The semiconductor device 121 further includes the insulating part 80 (referring to FIG. 2C). Other than the source connection member 31CN, the configuration of the semiconductor device 121 is similar to, for example, the configuration of the semiconductor device 121.

The source connection member 31CN electrically connects the first source electrode 31A to the second source electrode 31B. The position in the first direction (the Y-axis direction) of the source connection member 31CN is between the position in the first direction of the ninth portion 32i and the position in the first direction of the first drain electrode 33A. For example, the source connection member 31CN electrically connects the multiple source electrodes 31 to each other. For example, the multiple source electrodes 31 and the source connection member 31CN are inside the region surrounded with the gate electrode 32 (e.g., the first gate electrode 32A) in the X-Y plane. In the semiconductor device 121, the gate electrode 32 (e.g., the first gate electrode 32A) exists in the path cp between the multiple source electrodes 31 (the first source electrode 31A and the second source electrode 31B) and the drain electrode 33 (e.g., the first drain electrode 33A). For example, the leakage current can be suppressed. A semiconductor device can be provided in which the characteristics can be improved. In the semiconductor device 121 as well, the contamination of the processing apparatus used in the processing of introducing the first element E1 is suppressed.

In the embodiment, at least one of multiple source electrodes 31 includes, for example, at least one selected from the group consisting of Ti, Al, and W. At least one of the multiple drain electrodes 33 includes, for example, at least one selected from the group consisting of Ti, Al, and W. At least one of the multiple gate electrodes 32 includes, for example, at least one selected from the group consisting of Ti, W, Ni, Pt, Au, and Ta.

In the configurations illustrated in the drawings described above, the direction from a portion (the lower portion) of the gate electrode 32 toward the second semiconductor layer 12 is along the X-axis direction. For example, the portion (the lower portion) of the gate electrode 32 faces the second semiconductor layer 12 in the X-axis direction. The direction from the portion (the lower portion) of the gate electrode 32 toward the first semiconductor layer 11 may be along the X-axis direction. For example, these semiconductor devices have recessed structures. In the embodiment, a portion of the gate electrode 32 may not face the second semiconductor layer 12 in the X-axis direction. For example, the embodiments are applicable to a lateral JFET (Junction-FET) structure. For example, the embodiments are applicable to a lateral normally-on structure.

According to the embodiment, a semiconductor device can be provided in which the efficiency can be increased.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as semiconductor members, semiconductor layers, electrodes, insulating parts, insulating films, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a semiconductor member including a first semiconductor layer and a second semiconductor layer, the first semiconductor layer including $Al_{x1}Ga_{1-x1}N$ ($0 \le x1 < 1$), the second semiconductor layer including $Al_{x2}Ga_{1-x2}N$ ($0 < x2 \le 1$ and $x1 < x2$);
a first source electrode extending along a first direction;
a first gate electrode including a first portion, a second portion, a third portion, and a fourth portion, the first source electrode being between the first portion and the second portion in the first direction, the first source electrode being between the third portion and the fourth portion in a second direction crossing the first direction, the third portion and the fourth portion extending along the first direction, a third direction being from the first semiconductor layer toward the second semiconductor layer and crossing a plane including the first and second directions;
a first drain electrode extending along the first direction, the first source electrode being between the third portion and the first drain electrode in the second direction, the fourth portion being between the first source electrode and the first drain electrode in the second direction;
a source pad part;
a first source connection part electrically connecting the first source electrode and the source pad part; and
an insulating part including a first insulating region, at least a portion of the first insulating region being between the first portion and the first source connection part in the third direction.

2. The device according to claim 1, wherein
the semiconductor member includes:
an element region; and
a peripheral region around the element region in the plane,
the peripheral region includes a first peripheral portion and a second peripheral portion,
the semiconductor member includes:
a first boundary between the element region and the first peripheral portion; and
a second boundary between the element region and the second peripheral portion,
a direction from the first boundary toward the second boundary is along the first direction,
a position in the first direction of the first portion is between a position in the first direction of the first boundary and a position in the first direction of the second boundary,
a position in the first direction of the second portion is between a position in the first direction of the first source electrode and the position in the first direction of the second boundary, and
a crystallinity in the peripheral region is less than a crystallinity in the element region.

3. The device according to claim 2, wherein
the peripheral region includes a third peripheral portion and a fourth peripheral portion,
the semiconductor member includes:
a third boundary between the element region and the third peripheral portion; and
a fourth boundary between the element region and the fourth peripheral portion,
a direction from the third boundary toward the fourth boundary is along the second direction,
a position in the second direction of the third portion is between a position in the second direction of the third boundary and a position in the second direction of the fourth boundary, and
a position in the second direction of the first drain electrode is between a position in the second direction of the fourth portion and the position in the second direction of the fourth boundary.

4. The device according to claim 2, wherein
the first peripheral portion overlaps the source pad part in the third direction.

5. The device according to claim 2, wherein
the first portion is continuous with at least one of the third portion or the fourth portion.

6. The device according to claim 2, wherein
the second portion is continuous with at least one of the third portion or the fourth portion.

7. The device according to claim 2, wherein
the first gate electrode surrounds the first source electrode in the plane.

8. The device according to claim 2, further comprising:
a drain pad part electrically connected to the first drain electrode,
a position in the first direction of the second portion being between a position in the first direction of the first source electrode and a position in the first direction of the drain pad part.

9. The device according to claim 8, wherein
the position in the first direction of the second boundary is between the position in the first direction of the second portion and the position in the first direction of the drain pad part.

10. The device according to claim 2, further comprising:
a second source electrode extending along the first direction;
a second gate electrode; and
a second source connection part,
the second gate electrode including a fifth portion, a sixth portion, a seventh portion, and an eighth portion,
the second source electrode being between the fifth portion and the sixth portion in the first direction, the second source electrode being between the seventh portion and the eighth portion in the second direction,
the seventh portion and the eighth portion extending along the first direction,
the seventh portion being between the first drain electrode and the eighth portion in the second direction,
the second source connection part electrically connecting the second source electrode and the source pad part,
the first insulating region being between the fifth portion and the second source connection part in the third direction.

11. The device according to claim 10, wherein
the fifth portion is directly continuous with at least one of the seventh portion or the eighth portion.

12. The device according to claim 11, wherein
the sixth portion is directly continuous with at least one of the seventh portion or the eighth portion.

13. The device according to claim 10, wherein
the second gate electrode surrounds the second source electrode in the plane.

14. The device according to claim 10, further comprising:
a drain pad part electrically connected to the first drain electrode,
the position in the first direction of the second portion being between the position in the first direction of the first source electrode and a position in the first direction of the drain pad part,
a position in the first direction of the sixth portion being between a position in the first direction of the second source electrode and the position in the first direction of the drain pad part.

15. The device according to claim 10, further comprising:
a gate connection member,
the gate connection member electrically connecting the fifth portion to the first portion.

16. The device according to claim 2, further comprising:
a second source electrode extending along the first direction;
a second source connection part; and
a drain pad part electrically connected to the first drain electrode,
the first gate electrode including a fifth portion, a sixth portion, a seventh portion, an eighth portion, and a ninth portion,
the second source electrode being between the fifth portion and the sixth portion in the first direction,
the second source electrode being between the seventh portion and the eighth portion in the second direction,
the seventh portion and the eighth portion extending along the first direction,
the seventh portion being between the first drain electrode and the eighth portion in the second direction,
the ninth portion being connected to the fourth and seventh portions,
the second source connection part electrically connecting the second source electrode and the source pad part,
the first insulating region being between the fifth portion and the second source connection part in the third direction,
a position in the first direction of the first drain electrode being between a position in the first direction of the ninth portion and a position in the first direction of the drain pad part.

17. The device according to claim 16, wherein
the first gate electrode surrounds the first and second source electrodes in the plane.

18. The device according to claim 16, wherein
the position in the first direction of the second portion is between the position in the first direction of the first source electrode and the position in the first direction of the drain pad part, and
a position in the first direction of the sixth portion is between a position in the first direction of the second source electrode and the position in the first direction of the drain pad part.

19. The device according to claim 10, further comprising:
a source connection member,
the source connection member electrically connecting the first source electrode to the second source electrode.

20. The device according to claim 1, wherein
the first semiconductor layer includes a first partial region, a second partial region, a third partial region, a fourth partial region, a fifth partial region, and a sixth partial region,
the second semiconductor layer includes a first semiconductor portion and a second semiconductor portion,
the second partial region is between the first partial region and the fifth partial region in the second direction,
the third partial region is between the first partial region and the second partial region in the second direction,
the fourth partial region is between the third partial region and the second partial region in the second direction,
the sixth partial region is between the second partial region and the fifth partial region in the second direction,
a direction from the first partial region toward the third portion is along the third direction,
a direction from the second partial region toward the fourth portion is along the third direction,
a direction from the third partial region toward the first source electrode is along the third direction,
a direction from the fourth partial region toward the first drain electrode is along the third direction,
a direction from the fourth partial region toward the first semiconductor portion is along the third direction, a direction from the fifth partial region toward the first drain electrode is along the third direction, and a direction from the sixth partial region toward the second semiconductor portion is along the third direction.

\* \* \* \* \*